(12) United States Patent
Okigawa

(10) Patent No.: US 9,386,285 B2
(45) Date of Patent: Jul. 5, 2016

(54) IMAGING ELEMENT AND IMAGING DEVICE WITH MICROLENSES AND COLOR PIXELS

(71) Applicant: FUJIFILM Corporation, Tokyo (JP)

(72) Inventor: Mitsuru Okigawa, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/562,361

(22) Filed: Dec. 5, 2014

(65) Prior Publication Data

US 2015/0092092 A1 Apr. 2, 2015

Related U.S. Application Data

(63) Continuation of application No. PCT/JP2013/062255, filed on Apr. 25, 2013.

(30) Foreign Application Priority Data

Jun. 7, 2012 (JP) .................................. 2012-129816

(51) Int. Cl.
*H04N 9/04* (2006.01)
*H01L 27/146* (2006.01)

(52) U.S. Cl.
CPC .......... *H04N 9/045* (2013.01); *H01L 27/14621* (2013.01); *H01L 27/14627* (2013.01)

(58) Field of Classification Search
CPC ............... H04N 9/045; H04N 5/2254; H04N 2209/045; H01L 27/14621; H01L 27/14627; H01L 27/14625
USPC ................... 348/340, 280, 294, 273, 345, 349
See application file for complete search history.

(56) References Cited

U.S. PATENT DOCUMENTS

2007/0014019 A1* 1/2007 Mouli ................... H04N 9/045
359/619
2010/0238330 A1 9/2010 Hirota
(Continued)

FOREIGN PATENT DOCUMENTS

CN 103503438 A 1/2014
JP 2007-317951 A 12/2007
(Continued)

OTHER PUBLICATIONS

International Search Report, issued in PCT/JP2013/062255, dated Jun. 11, 2013.
(Continued)

*Primary Examiner* — Nhan T Tran
(74) *Attorney, Agent, or Firm* — Birch, Stewart, Kolasch & Birch, LLP

(57) ABSTRACT

An imaging element having a plurality of pixel cells which is arranged in a row direction and a column direction which is perpendicular to the row direction in a lattice, in which two adjacent pixel cells which include photoelectric convening units which detect the same color light form a pair and the pairs are periodically arranged, in each of pixel cell rows in which pixel cells are arranged in the row direction, the micro lenses are arranged such that the micro lenses in odd-numbered pixel cell rows is off-centered in the row direction from the micro lenses in even-numbered pixel cell rows by a half of an arrangement pitch of the micro lenses, and each micro lens which is provided in at least one of the odd-numbered row and the even-numbered row is disposed over two photoelectric converting units which detect different color light.

6 Claims, 11 Drawing Sheets

(56) References Cited

U.S. PATENT DOCUMENTS

2013/0222546 A1    8/2013   Takahashi
2014/0071244 A1    3/2014   Hirota

FOREIGN PATENT DOCUMENTS

| | | | |
|---|---|---|---|
| JP | 2010-239337 A | 10/2010 | |
| JP | WO 2012026292 A1 * | 3/2012 | ............ G02B 3/0056 |
| JP | WO 2012161225 A1 * | 11/2012 | ......... H04N 13/0217 |
| WO | WO 2012/042963 A1 | 4/2012 | |
| WO | WO 2012/161225 A1 | 11/2012 | |

OTHER PUBLICATIONS

JP Office Action, issued in 2014-519881 dated on Oct. 28, 2014.

Written Opinion of the International Searching Authority, issued in PCT/JP2013/062255, dated Jun. 11, 2013.

Chinese Office Action issued in the corresponding Chinese Patent Application No. 201380029917.8, mailed on Sep. 6, 2015, along with an English translation.

\* cited by examiner

○ R SAMPLING POSITION
○ G SAMPLING POSITION
◉ B SAMPLING POSITION

○ R SAMPLING POSITION
○ G SAMPLING POSITION
● B SAMPLING POSITION

◉ R SAMPLING POSITION
○ G SAMPLING POSITION
⊙ B SAMPLING POSITION

○ R SAMPLING POSITION
○ G SAMPLING POSITION
◉ B SAMPLING POSITION

○ R SAMPLING POSITION
○ G SAMPLING POSITION
● B SAMPLING POSITION

IMAGING ELEMENT AND IMAGING DEVICE WITH MICROLENSES AND COLOR PIXELS

CROSS REFERENCE TO RELATED APPLICATION

This is a continuation of International Application No. PCT/JP2013/062255, filed on Apr. 25, 2013 and claims priority from Japanese Patent Application No. 2012-129816, filed on Jun. 7, 2012, the entire disclosures of which are incorporated herein by reference.

BACKGROUND

1. Technical Field

The present invention relates to an imaging element and an imaging device.

2. Related Art

Recently, as the resolution of a solid-state imaging element such as a charge coupled device (CCD) image sensor and a complementary metal oxide semiconductor (CMOS) image sensor becomes higher, a demand for an information equipment having an imaging function such as a digital still camera, a digital video camera, a cellular phone such as a smart phone, and a personal digital assistant (PDA) is rapidly increasing. Further, the information equipment having an imaging function as described above is referred to as an imaging device.

In such an imaging device, as a focus control method which focuses on a major subject, a contrast auto focus (AF) method or a phase difference AF method is employed. Since the phase difference AF method may detect a focusing position with high precision at a high speed as compared with the contrast AF method, the phase difference AF method is widely employed in various imaging devices.

For example, Patent Literature 1 (JP-A-2007-317951) discloses an imaging device which performs the phase difference AF by a solid-state imaging element in which a plurality of pixel cells having a plurality of photoelectric converting units having different spectral sensitivity characteristics is regularly arranged below one micro lens.

Further, using a technology of detecting a phase difference, an imaging device which obtains an image when the subject is viewed from two different points of view to enable stereoscopic imaging has been suggested.

For example, Patent Literature 2 (JP-A-2010-239337) discloses an imaging device in which four photoelectric converting units which detect the same color light are considered as one unit and a solid-state imaging element in which the units are two-dimensionally arranged is used to allow the phase difference AF or the stereoscopic imaging. The solid-state imaging element is configured such that four photoelectric converting units (two in upper and lower portions X two in left and right portions) share one micro lens and each micro lens is disposed over the photoelectric converting units which detect different colors.

SUMMARY OF INVENTION

Like the solid-state imaging elements disclosed in Patent Literatures 1 and 2, according to a configuration where a plurality of photoelectric convening units shares one micro lens, since a spatial sampling position of light is determined at a center position of the micro lens, the resolution is lowered as compared with a general imaging element in which one micro lens is provided for one photoelectric converting unit.

The main objects of Patent Literatures 1 and 2 are to prevent degradation of image quality at the time of a pixel interpolation processing or reduce a memory capacity which is used for the image processing while improvement of the resolution is not a main object thereof. Therefore, improvement of the resolution is left to be considered.

In view of above, an illustrative aspect of the present invention intends to improve a resolution of an imaging element which is configured such that one micro lens is provided for two photoelectric converting units.

An aspect of the present invention provides an imaging element having a plurality of pixel cells which is arranged in a row direction and a column direction which is perpendicular to the row direction in a lattice, in which the plurality of pixel cells includes a first pixel cell which includes a photoelectric convening unit which detects red light, a second pixel cell which includes a photoelectric converting unit which detects green light, and a third pixel cell which includes a photoelectric converting unit which detects blue light, two adjacent pixel cells which include photoelectric converting units which detect the same color light form a pair and the pairs are periodically arranged, in each of pixel cell rows in which pixel cells are arranged in the row direction, one micro lens is disposed over two photoelectric converting units which are included in the two pixel cells at every two pixel cells which are adjacent in the row direction, the micro lenses are arranged such that the micro lenses in odd-numbered pixel cell rows is off-centered in the row direction from the micro lenses in even-numbered pixel cell rows by a half of an arrangement pitch of the micro lenses, and each micro lens which is provided in at least one of the odd-numbered row and the even-numbered row is disposed over two photoelectric converting units which detect different color light.

Another aspect of the present invention provides an imaging device including the imaging element.

According to any aspect of the present invention, in an imaging element which is configured such that one micro lens is provided for two photoelectric converting units, the resolution may be improved.

BRIEF DESCRIPTION OF DRAWINGS

FIG. 6 is a diagram for explaining a spatial sampling position of light by the imaging element 5a.

DESCRIPTION OF EMBODIMENTS

Hereinafter, an embodiment of the present invention will be described with reference to the drawings.

Figure 1:
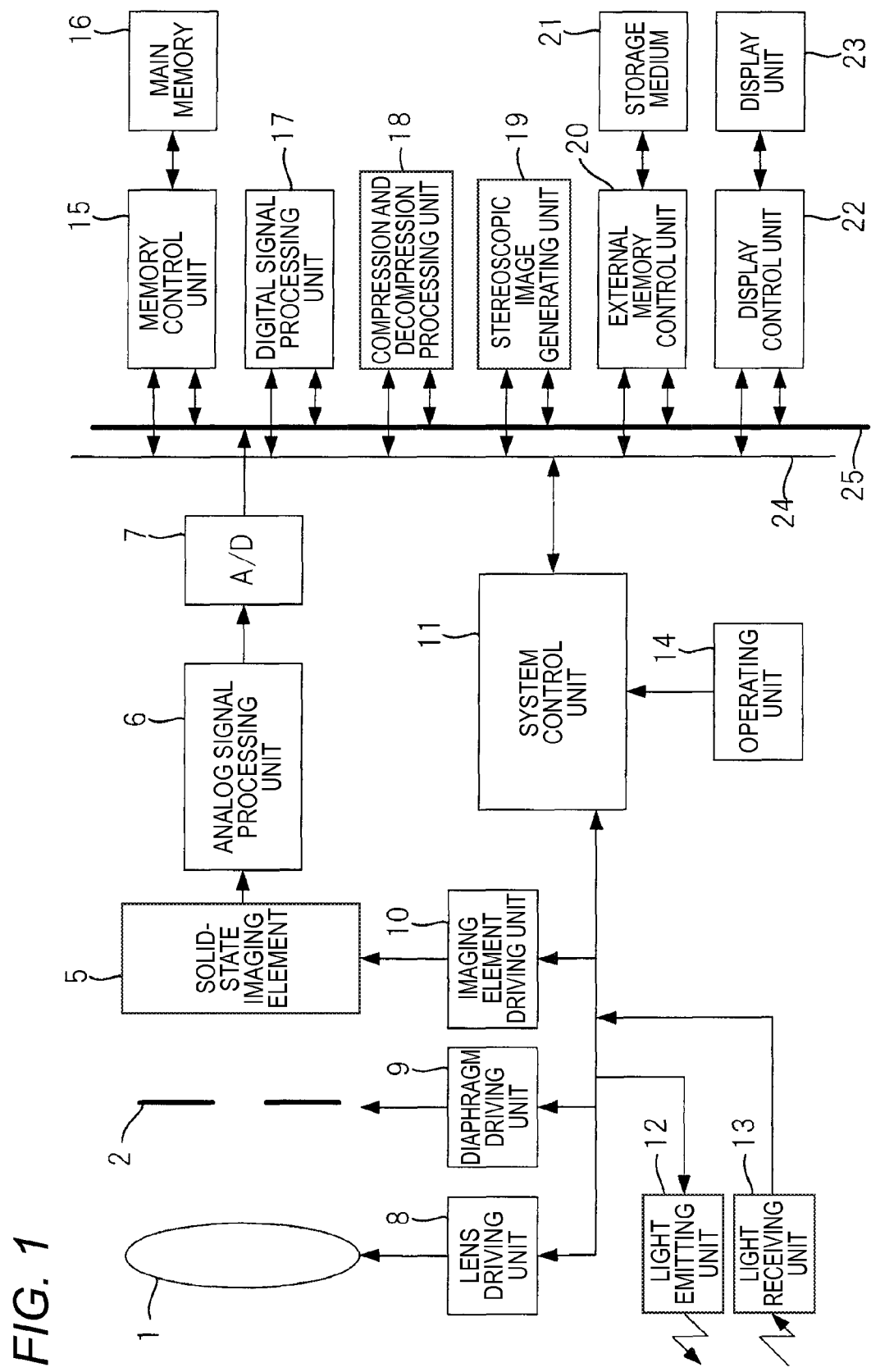
FIG. 1 is a diagram illustrating a schematic configuration of a digital camera as an example of an imaging device for explaining an embodiment of the present invention.

FIG. 1 is a diagram illustrating a schematic configuration of a digital camera as an example of an imaging device for explaining an embodiment of the present invention.

An imaging system of a digital camera illustrated in FIG. 1 includes a photographing imaging lens 1 as a photographing optical system, an imaging element 5 such as a CCD image sensor and a CMOS image sensor, and a diaphragm 2 provided therebetween.

A system control unit 11 which collectively controls an entire electrical control system of the digital camera controls a flash light emitting unit 12 and a light receiving unit 13. Further, the system control unit 11 controls a lens driving unit 8 by a phase difference AF method to adjust a position of a focus lens which is included in the photographing lens 1 or a position of the zoom lens which is included in the photographing lens 1. Further, the system control unit 1 controls an aperture size of the diaphragm 2 through a diaphragm driving unit 9 so as to adjust an exposure amount.

The system control unit 11 drives the imaging element 5 through an imaging element driving unit 10 to output a subject image captured through the photographing lens 1 as a captured image signal. An instruction signal from a user is input to the system control unit 11 through an operating unit 14.

The electrical control system of the digital camera further includes an analog signal processing unit 6 connected to an output of the imaging element 5 to perform an analog signal processing such as a correlated double sampling processing and an A/D converting circuit 7 which converts an analog signal output from the analog signal processing unit 6 into a digital signal. The analog signal processing unit 6 and the A/D converting circuit 7 are controlled by the system control unit 11. The analog signal processing unit 6 and the A/D converting circuit 7 are embedded in the imaging element 5 in some cases.

The electrical control system of the digital camera includes a main memory 16, a memory control unit 15 which is connected to the main memory 16, a digital signal processing unit 17 which performs an interpolation operation, a gamma correction operation, and an RGB/YC conversion processing on a captured imaging signal output from the A/D converting circuit 7 to generate photographed image data, a compression and decompression processing unit 18 which compresses the photographed image data generated in the digital signal processing unit 17 in a JPEG format or decompresses the compressed image data, a stereoscopic image generating unit 19 which generates stereoscopic image data using two captured image data obtained by photographing from two points of view which are generated by the signal processing unit 17, an external memory control unit 20 to which a detachable recording medium 21 is connected, and a display control unit 22 to which a display unit 23 mounted on a rear surface of a camera is connected. The memory control unit 15, the digital signal processing unit 17, the compression/decompression processing unit 18, the stereoscopic image generating unit 19, the external memory control unit 20, and the display control unit 22 are connected to each other by a control bus 24 and a data bus 25 to be controlled by a command from the system control unit 11.

Figure 2:
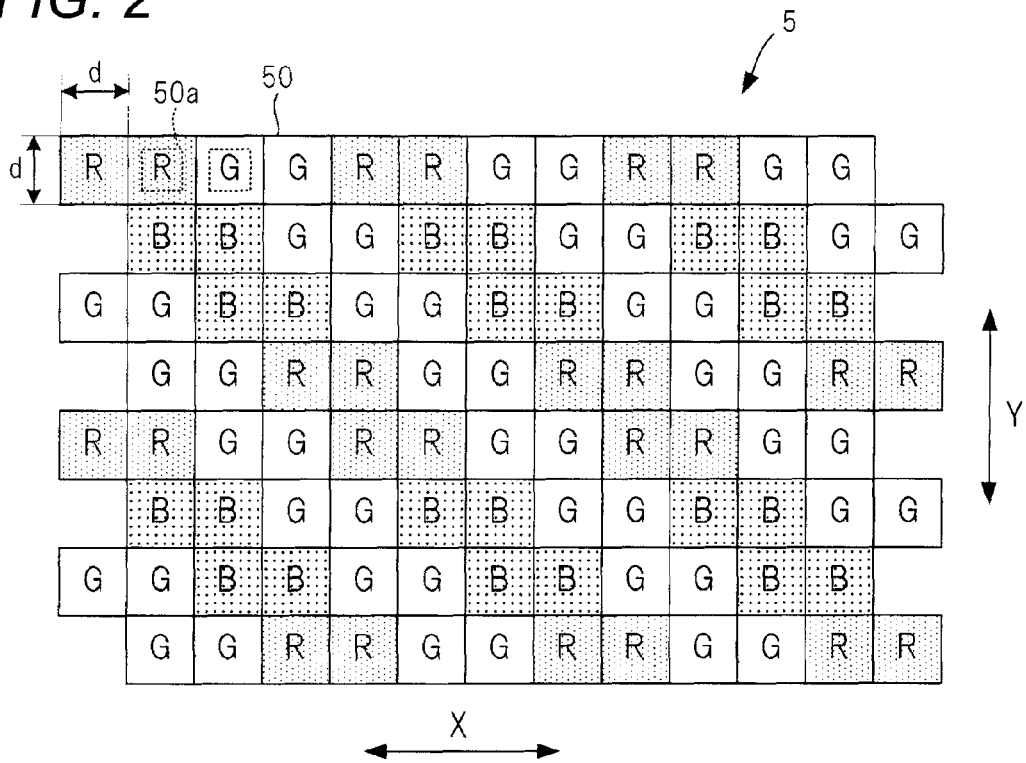
FIG. 2 is a schematic plan view illustrating a configuration of an imaging element 5 which is mounted in the digital camera illustrated in FIG. 1.

FIG. 2 is a schematic plan view illustrating a configuration of the imaging element 5 which is mounted in the digital camera illustrated in FIG. 1.

The imaging element 5 includes a plurality of pixel cells 50 (a square shaped block having a length d of one side in the drawing) which is arranged in a row direction X and a column direction Y, which is perpendicular to the row direction, in a lattice. In the example of FIG. 2, the pixel cells 50 are arranged in the row direction X and the column direction Y at a pitch d. Arrangement pitches of the pixel cells 50 in the row direction X and the column direction Y may not be equal to each other.

Each pixel cell 50 includes a photoelectric converting unit such as a photo diode and a color filter which is formed above the photoelectric converting unit. Further, in FIG. 2, a portion (a light receiving surface 50a) which is not shielded in the photoelectric converting unit is illustrated only in some of the pixel cells 50. An upper portion of the photoelectric convening unit refers to a direction in which light is incident onto the photoelectric converting unit.

In FIG. 2, a pixel cell 50 (hereinafter, referred to as an R pixel cell 50) including a color filter through which red light passes is denoted by a reference character R, a pixel cell 50 (hereinafter, referred to as a G pixel cell 50) including a color filter through which green light passes is denoted by a reference character G, and a pixel cell 50 (hereinafter, referred to as a B pixel cell 50) including a color filter through which blue light passes is denoted by a reference character B. In order to easily recognize a color filter arrangement, the R pixel cell 50 and the B pixel cell 50 are shaded by hatch marks.

A plurality of pixel cells 50 is arranged such that a plurality of pixel cell rows which is formed of a plurality of pixel cells 50 which is arranged in the row direction X is arranged in the column direction Y. An odd-numbered pixel cell row and an even-numbered pixel cell row are off-centered by an arrangement pitch of the pixel cell 50 of each pixel cell row in the row direction X.

In each pixel cell row, two adjacent pixel cells 50 which includes photoelectric converting unit detecting the same color light form a pair and the pairs are continuously disposed. The pairs in the odd-numbered row are off-centered from the pairs in the even-numbered row by a half of an arrangement pitch (=2d) of the pairs in each pixel cell row, in the row direction X. Hereinafter, a pair of the pixel cells 50 which detect the red light is referred to as an R pair, a pair of the pixel cells 50 which detect the green light is referred to as a G pair, and a pair of the pixel cells 50 which detect the blue light is referred to as a B pair.

In the odd-numbered row, an RG pair row in which the R pair and the G pair are alternately disposed and a GB pair row in which the G pair and the B pair are alternately disposed are alternately disposed in the column direction Y. That is, in the odd-numbered row, the R pair, the G pair, and the B pair are disposed in a Bayer pattern.

In the even-numbered row, a BG pair row in which the B pair and the G pair are alternately disposed and a GR pair row in which the G pair and the R pair are alternately disposed are alternately disposed in the column direction Y. That is, also in the even-numbered row, the R pair, the G pair, and the B pair are disposed in a Bayer pattern.

In the imaging element 5, in order to obtain an image by imaging a subject from two different points of view by one time imaging, a phase difference is caused between an output signal of one of the pixel cells and an output signal of the other pixel cell in each pair. Specifically, at every two pixel cells 50 which are adjacent to each other in the row direction X, one micro lens 51 is disposed over two photoelectric converting units which are included in two pixel cells 50. The micro lens 51 is provided above the photoelectric converting unit.

In the embodiment, in order to improve the resolution, one micro lens 51 is provided so as to correspond to two pixel cells 50 which are adjacent to each other with a boundary of two pairs therebetween, among four pixel cells 50 which are included in two pairs which are adjacent to each other in the row direction X. That is, the micro lens 51 in the odd-numbered pixel cell row is off-centered from the micro lens 51 in the even-numbered pixel cell row, by a half of the arrangement pitch (=2d) of the micro lenses 51 in the pixel cell rows, in the row direction X.

Figure 3:
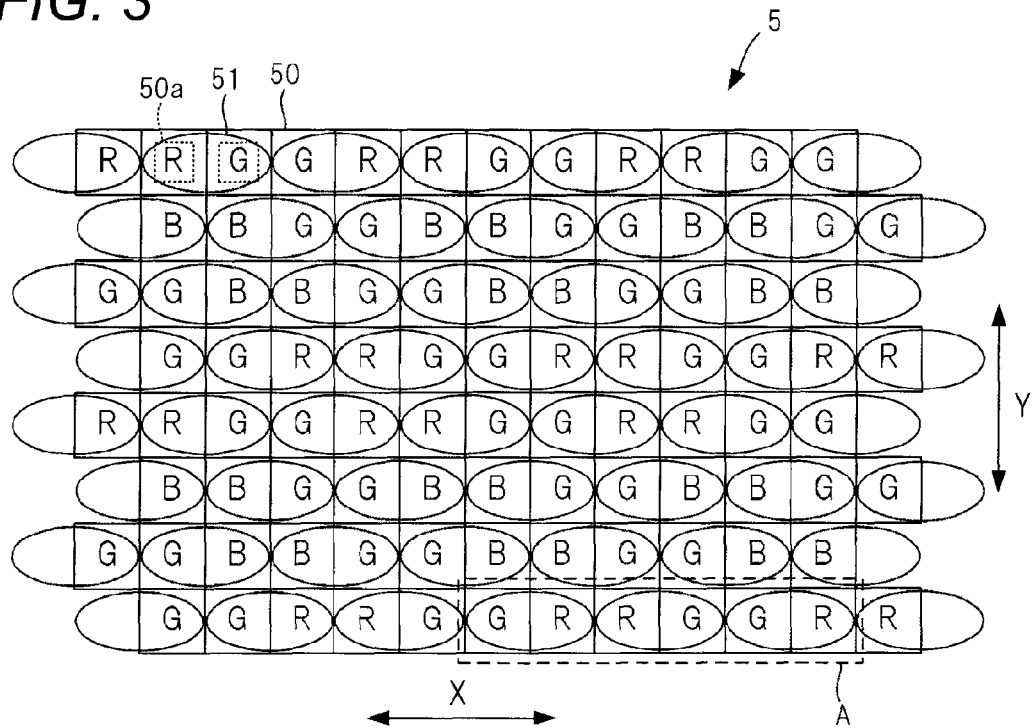
FIG. 3 is a diagram illustrating a micro lens which is mounted in the imaging element 5 illustrated in FIG. 1.

FIG. 3 is a diagram illustrating a micro lens which is mounted in the imaging element 5 illustrated in FIG. 1. In FIG. 3, in order to easily recognize the drawing, the hatch marks in the R pixel cell 50 and the B pixel cell 50 are omitted.

As illustrated in FIG. 3, the micro lens 51 is provided for two pixel cells 50 which are adjacent to each other with the boundary of two adjacent pairs therebetween. That is, the arrangement of the micro lenses 51 is a so-called honeycomb arrangement in which the micro lens 51 in the odd-numbered pixel cell row is off-centered from the micro lens 51 in the even-numbered pixel cell row, by a half of the arrangement pitch of the micro lenses 51 in the pixel cell rows, in the row direction X.

An optical axis of the micro lens 51 coincides with a position of a center of gravity of the pair of two corresponding pixel cells 50. Further, light receiving surfaces 50a of two photoelectric converting units which are below the micro lens 51 are symmetric to each other with respect to a straight line which passes through the optical axis of the micro lens 51 and extends in the column direction Y.

With this configuration, light which passes through the right half of the photographing lens 1 when seen from the imaging element 5 is mainly incident onto the photoelectric converting of the left pixel cell 50 corresponding to the micro lens 51 and light which passes through the left half of the photographing lens 1 when seen from the imaging element 5 is mainly incident onto the photoelectric converting of the right pixel cell 50 corresponding to the micro lens. That is, in each of the pairs, a left pixel cell 50 and a right pixel cell 50 become pixel cells which receive light which passes through different parts of a pupil region of a photographing lens 1 and output a signal in accordance with an amount of received light.

As described above, since a phase difference is caused between an output signal group of the left pixel cell 50 of each pair and an output signal group of the right pixel cell 50 of each pair, the phase difference AF may be performed based on the phase difference of two output signal groups or stereoscopic image data which may be stereoscopically viewed may be generated using the two output signal groups.

Figure 4:
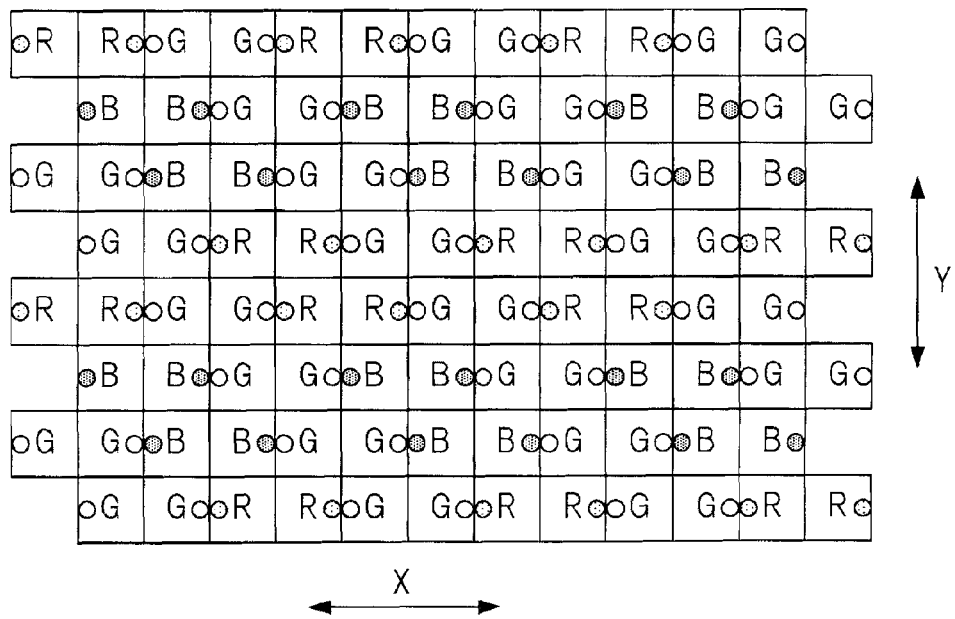
FIG. 4 is a diagram for explaining a spatial sampling position of light by the imaging element 5.

FIG. 4 is a diagram for explaining a spatial sampling position of light by the imaging element 5. A spatial sampling position of the light by the pixel cell 50 coincides with a position of the optical axis of the micro lens 51 corresponding to the pixel cell 50. In FIG. 4, a spatial sampling position of the light by the G pixel cell 50 is represented by a white circle, a spatial sampling position of the light by the R cell 50 is represented by a sparsely dot-shaded circle, and a spatial sampling position of the light by the B cell 50 is represented by a densely dot-shaded circle. In FIG. 4, the spatial sampling positions of two pixel cells 50 corresponding to the micro lenses 51 are slightly off-centered from the position of the optical axis of the micro lenses 51.

As illustrated in FIG. 4, in the row direction X, the imaging element 5 may sample the red light, the green light, and the blue light at a pitch d. Further, in the column direction Y, the imaging element 5 may sample the green light at a pitch d and sample the red light and the blue light at a pitch 4d. Furthermore, the imaging element 5 may sample the red light, the green light, and the blue light at a pitch $\sqrt{2}d$ in a direction of 45° at a right side and a direction of 45° at a left side with respect to the row direction X.

Figure 5:
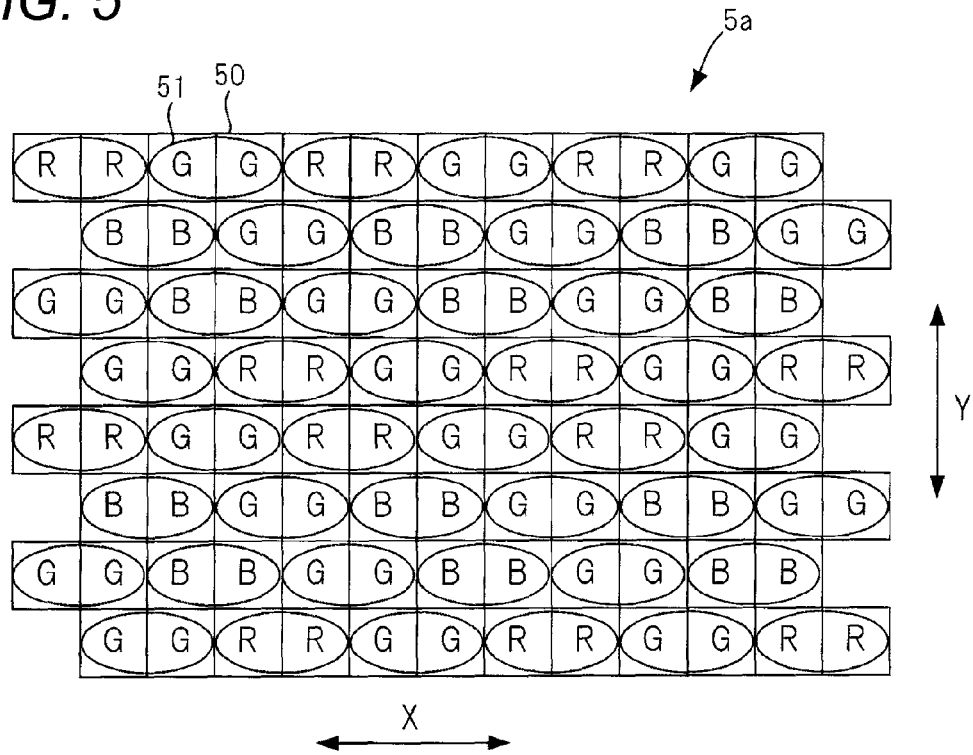
FIG. 5 is a diagram illustrating an imaging element 5a with a referenced configuration in which a micro lens 51 of the imaging element 5 is provided so as to correspond to two pixel cells 51 which form a pair.
Figure 6:
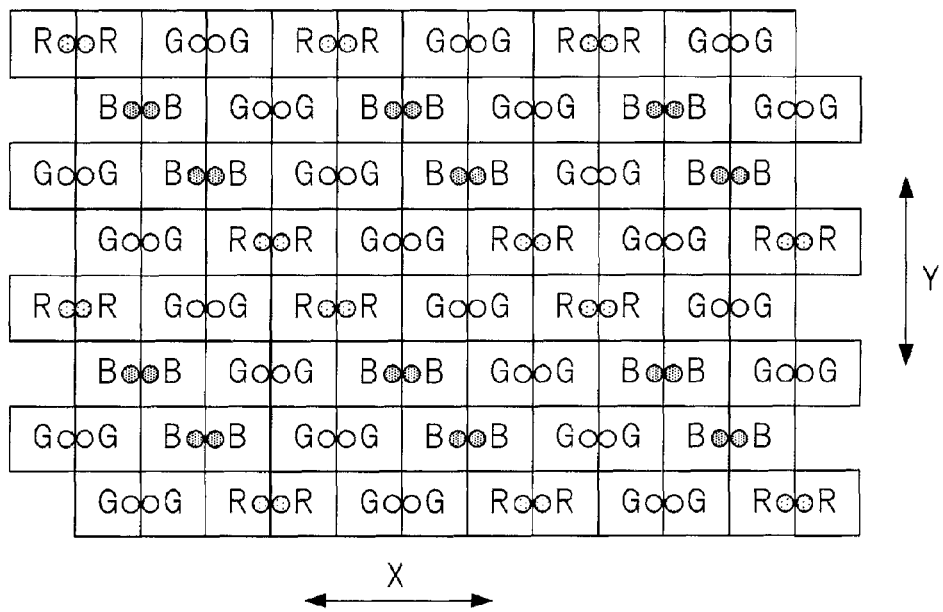

FIG. 5 is a view illustrating an imaging element 5a with a referenced configuration in which a micro lens 51 of the imaging element 5 is provided so as to correspond to two pixel cells 51 which form a pair. FIG. 6 is a diagram for explaining a spatial sampling position of light by the imaging element 5a.

The imaging element 5a may sample the green light at a pitch d and sample the red light and the blue light at a pitch 4d, in the row direction X. Further, in the column direction Y, the imaging element 5a may sample the green light at a pitch d and sample the red light and the blue light at a pitch 4d. Furthermore, the imaging element 5a may sample the red light, the green light, and the blue light at a pitch $2\sqrt{2}d$ in a direction of 45° at a right side with respect to the row direction X. Furthermore, the imaging element 5a may sample the red light, the green light, and the blue light at a pitch $\sqrt{2}d$ in a direction of 45° at a left side with respect to the row direction X.

An imaging element which is advantageous in a resolution is a general Bayer type imaging element in which the R pixel cell, the G pixel cell, and the B pixel cell are arranged in a Bayer pattern and one micro lens is disposed for every pixel cell. The Bayer type imaging element may sample the green light at a pitch d and sample the red light and the blue light at a pitch 2d, in the row direction X and the column direction Y. Furthermore, the imaging element 5 may sample the red light, the green light, and the blue light at a pitch $\sqrt{2}d$ in a direction of 45° at a right side and a direction of 45° at a left side with respect to the row direction X.

A result of organizing a sampling interval of the color light and a resolution (%) obtained by multiplying an inverse number of the sampling interval and 100 in the directions described above is represented in Table 1. Further, in a sampling row which is formed by sampling points which are arranged in the above-described directions, a result of calculating a ratio of rows in which all the red light, the green light, and the blue light are sampled for every direction is represented in Table 2. Further, in Tables 1 and 2, values for imaging elements 5b, 5c, and 5d which are modified examples of the imaging element 5 to be described below are represented.

X, the RGB light may be sampled in any of the sampling rows. As compared with the imaging element 5a or the Bayer type imaging element, a direction where all the RGB light is sampled in 100% of the row is increased so that it is also understood that the resolution is significantly improved by the imaging element 5.

TABLE 1

|  |  | Green light | | | | Red light, Blue light | | | |
| --- | --- | --- | --- | --- | --- | --- | --- | --- | --- |
|  |  | Row direction X | Column direction Y | Direction of 45° at right side | Direction of 45° at left side | Row direction X | Column direction Y | Direction of 45° at right side | Direction of 45° at left side |
| Imaging element 5a (Reference example) | Sampling interval [d] | 1 | 1 | $2\sqrt{2}$ | $\sqrt{2}$ | 4 | 4 | $2\sqrt{2}$ | $\sqrt{2}$ |
|  | Resolution (%) | 100 | 100 | 35.4 | 70.7 | 25 | 25 | 35.4 | 70.7 |
| Bayer type imaging element | Sampling interval [d] | 1 | 1 | $\sqrt{2}$ | $\sqrt{2}$ | 2 | 2 | $\sqrt{2}$ | $\sqrt{2}$ |
|  | Resolution (%) | 100 | 100 | 70.7 | 70.7 | 50 | 50 | 70.7 | 70,7 |
| Imaging element 5 (FIGS. 2 and 3) | Sampling interval [d] | 1 | 1 | $\sqrt{2}$ | $\sqrt{2}$ | 1 | 4 | $\sqrt{2}$ | $\sqrt{2}$ |
|  | Resolution (%) | 100 | 100 | 70.7 | 70.7 | 100 | 25 | 70.7 | 70.7 |
| Imaging element 5b (FIGS. 7 and 8) | Sampling interval [d] | 2 | 2 | $\sqrt{2}$ | $\sqrt{2}$ | 2 | 2 | $\sqrt{2}$ | $\sqrt{2}$ |
|  | Resolution (%) | 50 | 50 | 70.7 | 70.7 | 50 | 50 | 70.7 | 70.7 |
| Imaging element 5c (FIGS. 10 and 11) | Sampling interval [d] | 1 | 1 | $\sqrt{2}$ | $\sqrt{2}$ | 2 | 2 | $\sqrt{2}$ | $\sqrt{2}$ |
|  | Resolution (%) | 100 | 100 | 70.7 | 70.7 | 50 | 50 | 70.7 | 70.7 |
| Imaging element 5d (FIGS. 13 and 14) | Sampling interval [d] | 1 | 1 | $\sqrt{2}$ | $\sqrt{2}$ | 1 | 1 | $\sqrt{2}$ | $\sqrt{2}$ |
|  | Resolution (%) | 100 | 100 | 70.7 | 70.7 | 100 | 100 | 70.7 | 70.7 |

TABLE 2

| | Presence rate of all RGB colors in sampling row which extends in respective directions [%] | | | |
| --- | --- | --- | --- | --- |
|  | Row direction X | Column direction Y | Direction of 45° at right side | Direction of 45° at left side |
| Imaging element 5a (Reference example) | 0 | 0 | 100 | 0 |
| Bayer type imaging element | 0 | 0 | 0 | 0 |
| Imaging element 5 (FIGS. 2 and 3) | 0 | 100 | 100 | 100 |
| Imaging element 5b (FIGS. 7 and 8) | 0 | 0 | 100 | 100 |
| Imaging element 5c (FIGS. 10 and 11) | 0 | 0 | 100 | 100 |
| Imaging element 5d (FIGS. 13 and 14) | 100 | 100 | 100 | 100 |

As seen from Tables 1 and 2, according to the imaging element 5 of the embodiment, an equivalent resolution with the Bayer type imaging element may be obtained. Further, as compared with the imaging element 5a in which two pixel cells in the pair share the micro lens, the resolution may be improved. Further, in a direction other than the row direction X, the RGB light may be sampled in any of the sampling rows. As compared with the imaging element 5a or the Bayer type imaging element, a direction where all the RGB light is sampled in 100% of the row is increased so that it is also understood that the resolution is significantly improved by the imaging element 5.

Figure 7:
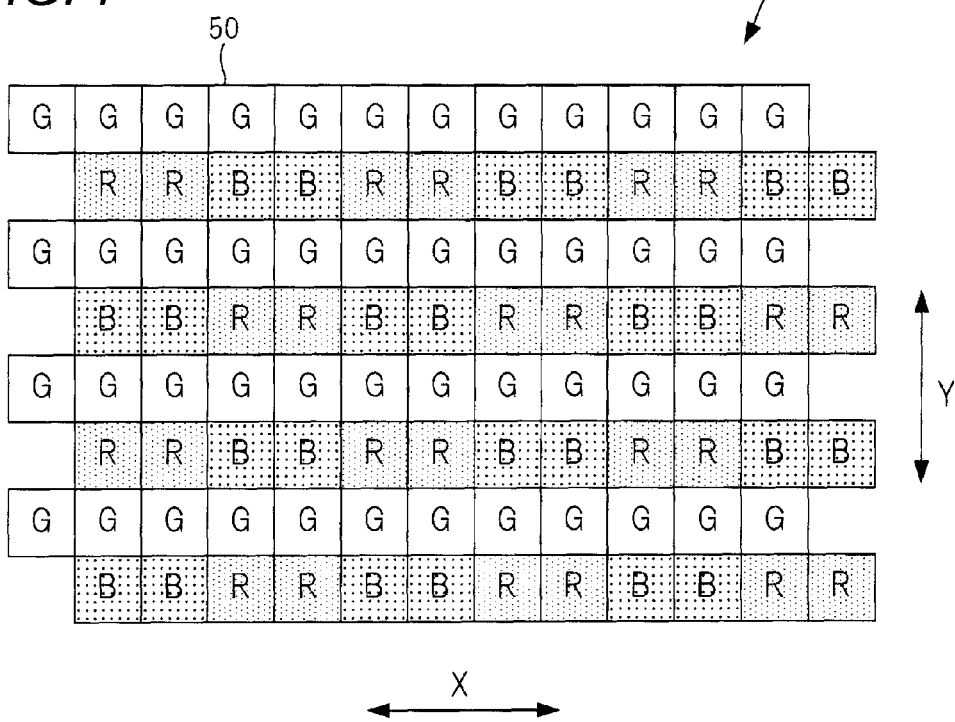
FIG. 7 is a schematic plan view illustrating a configuration of an imaging element 5b which is a modified example of the imaging element 5 illustrated in FIG. 1.

FIG. 7 is a schematic plan view illustrating a configuration of an imaging element 5b which is a modified example of the imaging element 5 illustrated in FIG. 1.

In the imaging element 5b, the R pair and the B pair of the odd-number row of the imaging element 5 are changed into the G pair, the G pair in the even-numbered row is changed into the B pair, and the B pair in the even-numbered row is changed into the R pair.

As described above, only G pairs are arranged in the odd-numbered row of the imaging element 5b and an RB pair row in which the R pairs and the B pairs are alternately arranged in the row direction X and a BR pair row in which the B pairs and the R pairs are alternately arranged in the row direction X are alternately arranged in the column direction Y, in the even-numbered row of the imaging element 5b. In other word, the imaging element 5b is configured such that the G pairs are arranged in a lattice in the odd-numbered row, the R pairs are arranged in positions of a checkerboard pattern in the even-numbered row and the B pairs are arranged in the remaining positions of the checkerboard pattern.

Figure 8:
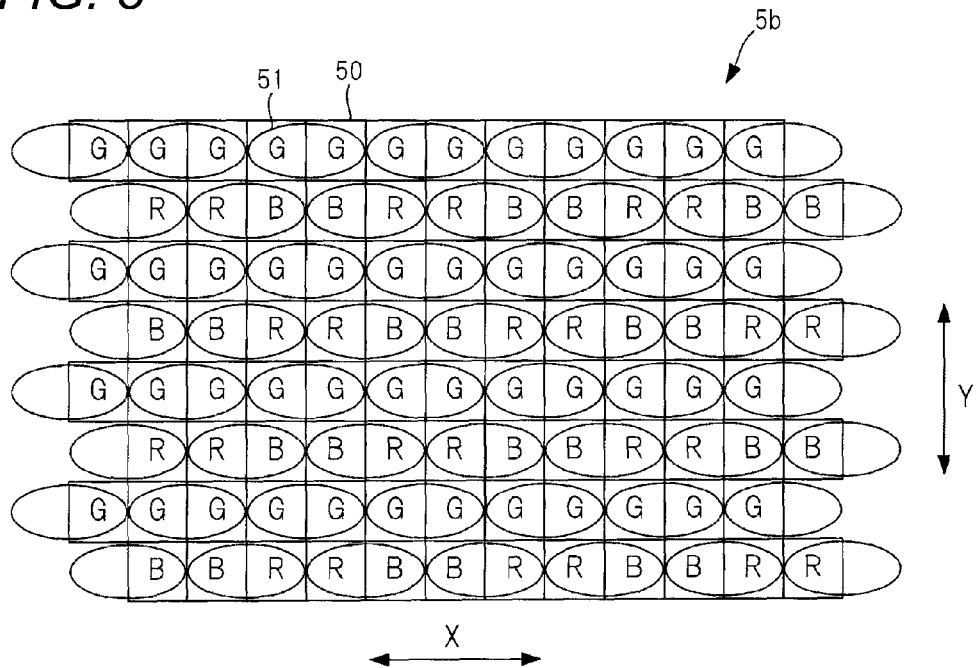
FIG. 8 is a diagram illustrating a micro lens which is mounted in the imaging element 5b illustrated in FIG. 7.

FIG. 8 is a diagram illustrating a micro lens which is mounted in the imaging element 5b illustrated in FIG. 7. In FIG. 8, in order to easily recognize the drawing, hatch marks in the R pixel cell 50 and the B pixel cell 50 are omitted.

Similarly to the imaging element 5, even in the imaging element 5b, micro lenses 51 are provided so as to correspond to two pixel cells 50, in the two pixel cells 50 which are adjacent to each other with a boundary of the two adjacent pairs therebetween, and the micro lenses 51 are arranged in a honeycomb arrangement.

Figure 9:
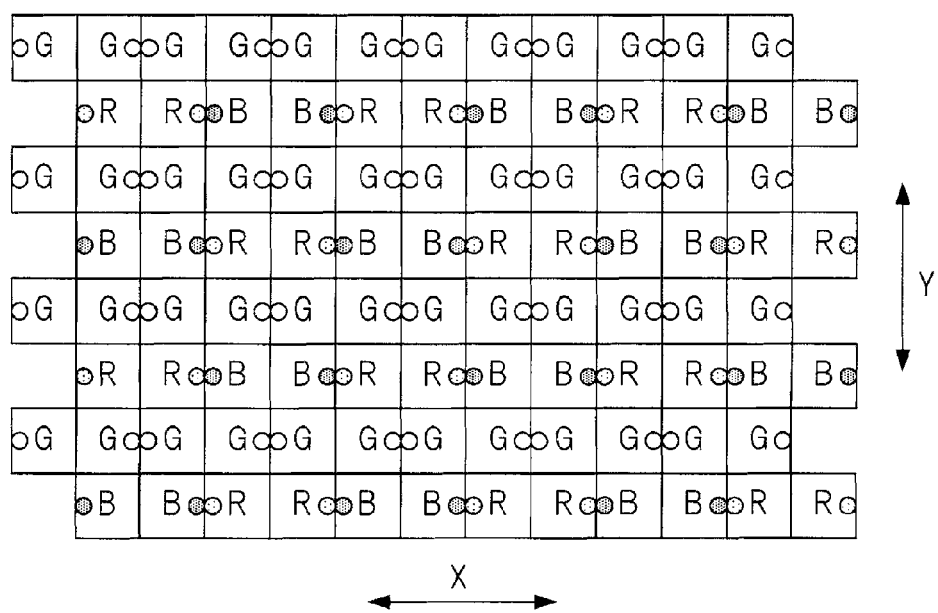
FIG. 9 is a diagram for explaining a spatial sampling position of light by the imaging element 5b.

FIG. 9 is a diagram for explaining a spatial sampling position of light by the imaging element 5b. In FIG. 9, a spatial sampling position of the light by the G pixel cell 50 is represented by a white circle, a spatial sampling position of the light by the R cell 50 is represented by a sparsely dot-shaded circle and a spatial sampling position of the light by the B cell 50 is represented by a densely dot-shaded circle.

As illustrated in FIG. 9, in the row direction X and the column direction Y, the imaging element 5b may sample the red light, the green light, and the blue light at a pitch 2d. Furthermore, the imaging element 5 may sample the red light, the green light, and the blue light at a pitch √2d in a direction of 45° at a right side and a direction of 45° at a left side with respect to the row direction X.

A result of the resolution of the imaging element 5b is as represented in Table 1. As represented in Table 1, an equivalent resolution with the Bayer type imaging element may be obtained by the imaging element 5b and the resolution may be improved as compared with the imaging element 5a in which two pixel cells of the pair share the micro lens.

In FIG. 7, even though the configuration where four G pixel cells 50 at a left edge of the odd-numbered row move to a right edge of the odd-numbered row, that is, a configuration where the pairs are arranged in a lattice is employed, the micro lenses 51 are arranged as illustrated in FIG. 8 so that the spatial sampling illustrated in FIG. 9 may be achieved and the resolution may be improved.

Figure 10:
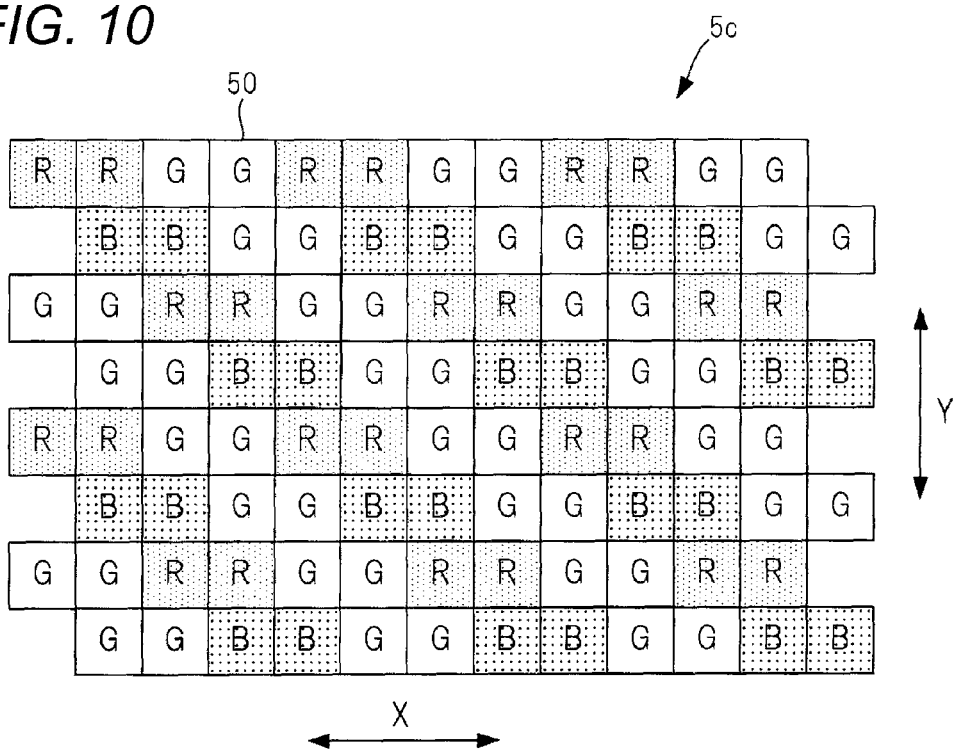
FIG. 10 is a schematic plan view illustrating a configuration of an imaging element 5c which is a modified example of the imaging element 5 illustrated in FIG. 1.

FIG. 10 is a schematic plan view illustrating a configuration of the imaging element 5c which is a modified example of the imaging element 5 illustrated in FIG. 1.

The imaging element 5c has the same configuration as the imaging element 5 except that the B pair of the GB pair row in the odd-numbered row are changed into the R pair and the R pair of the GR pair row in the even-numbered row is changed into the B pair. In other words, the imaging element 5c is configured such that the R pair is arranged in the positions of the checkerboard pattern and the G pair is arranged in the remaining positions of the checkerboard pattern in the odd-numbered row and the B pair is arranged in the positions of the checkerboard pattern and the G pair is arranged in the remaining positions of the checkerboard pattern in the even-numbered row.

Figure 11:
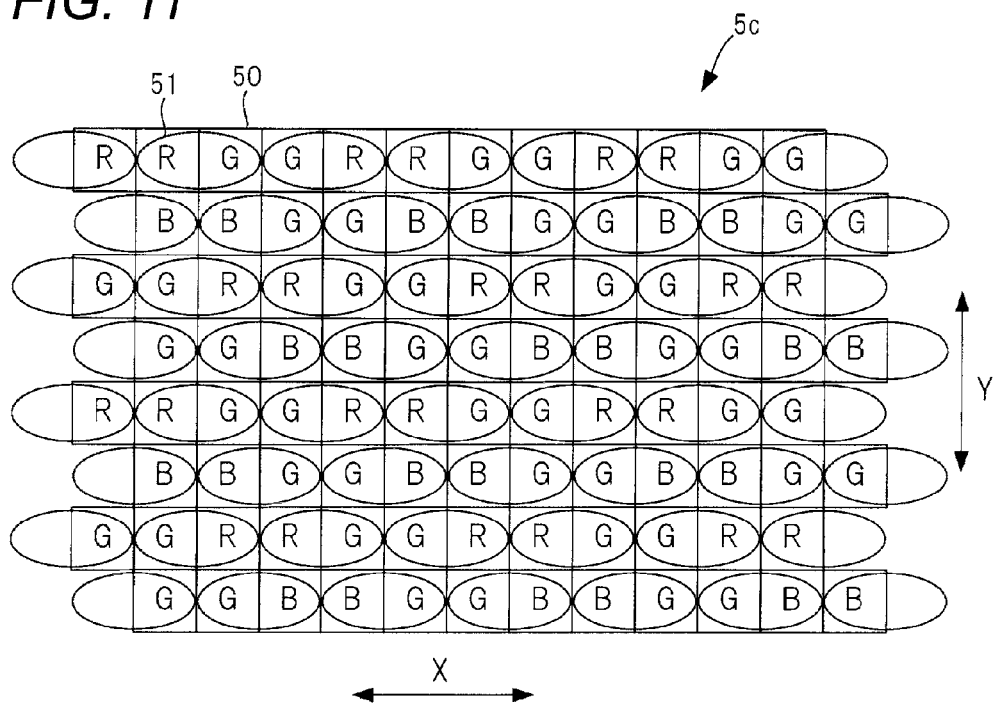
FIG. 11 is a diagram illustrating a micro lens which is mounted in the imaging element 5c illustrated in FIG. 10.

FIG. 11i is a diagram illustrating a micro lens which is mounted in the imaging element 5c illustrated in FIG. 10. In FIG. 11, in order to easily recognize the drawing, hatch marks in the R pixel cell 50 and the B pixel cell 50 are omitted.

Similarly to the imaging element 5, even in the imaging element 5c, micro lenses 51 are provided so as to correspond to two pixel cells 50, in the two pixel cells 50 which are adjacent to each other with a boundary of the two adjacent pairs therebetween and the micro lenses 51 are arranged in a honeycomb arrangement.

Figure 12:
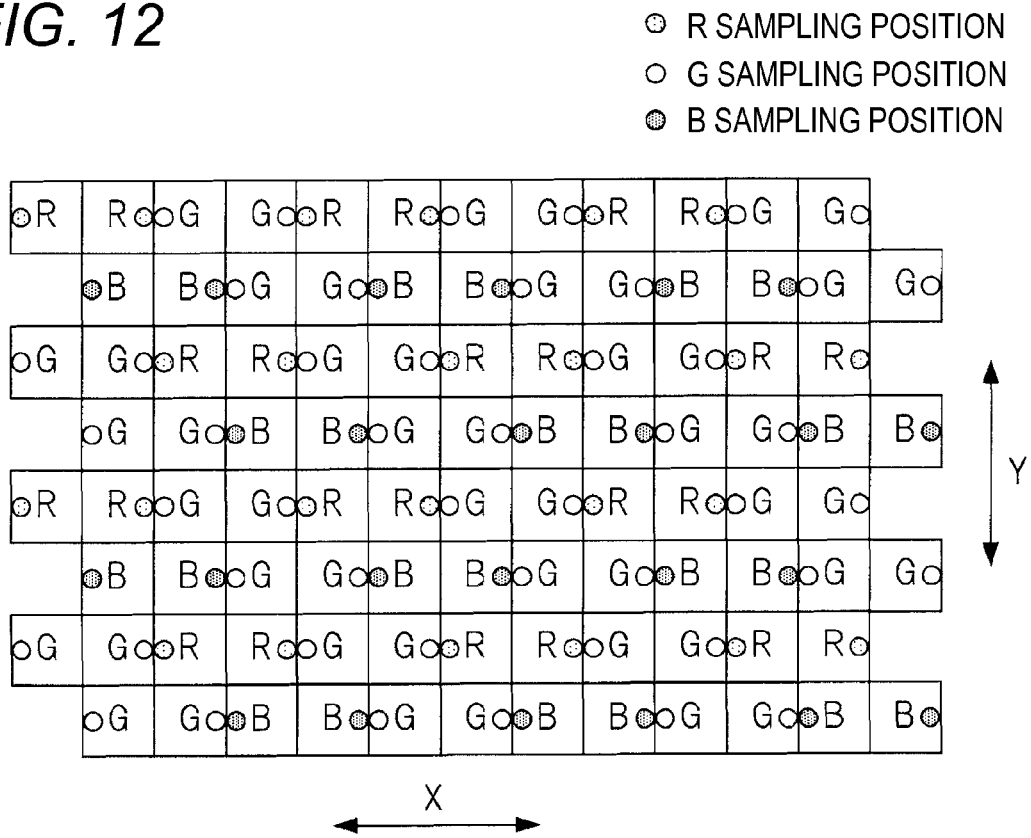
FIG. 12 is a diagram for explaining a spatial sampling position of light by the imaging element 5c.

FIG. 12 is a diagram for explaining a spatial sampling position of light by the imaging element 5c. In FIG. 12, a spatial sampling position of the light by the G pixel cell 50 is represented by a white circle, a spatial sampling position of the light by the R cell 50 is represented by a sparsely dot-shaded circle and a spatial sampling position of the light by the B cell 50 is represented by a densely dot-shaded circle.

As illustrated in FIG. 12, in the row direction X and the column direction Y, the imaging element 5c may sample the green light at a pitch d and sample the red light and the blue light at a pitch 2d. Furthermore, the imaging element 5 may sample the red light, the green light, and the blue light at a pitch √2d in a direction of 45° at a right side and a direction of 45° at a left side with respect to the row direction X.

A result of the resolution of the imaging element 5c is as represented in Table 1. As represented in Table 1, an equivalent resolution with the Bayer type imaging element may be obtained by the imaging element 5c and the resolution may be improved as compared with the imaging element 5a in which two pixel cells of the pair share the micro lens.

Figure 13:
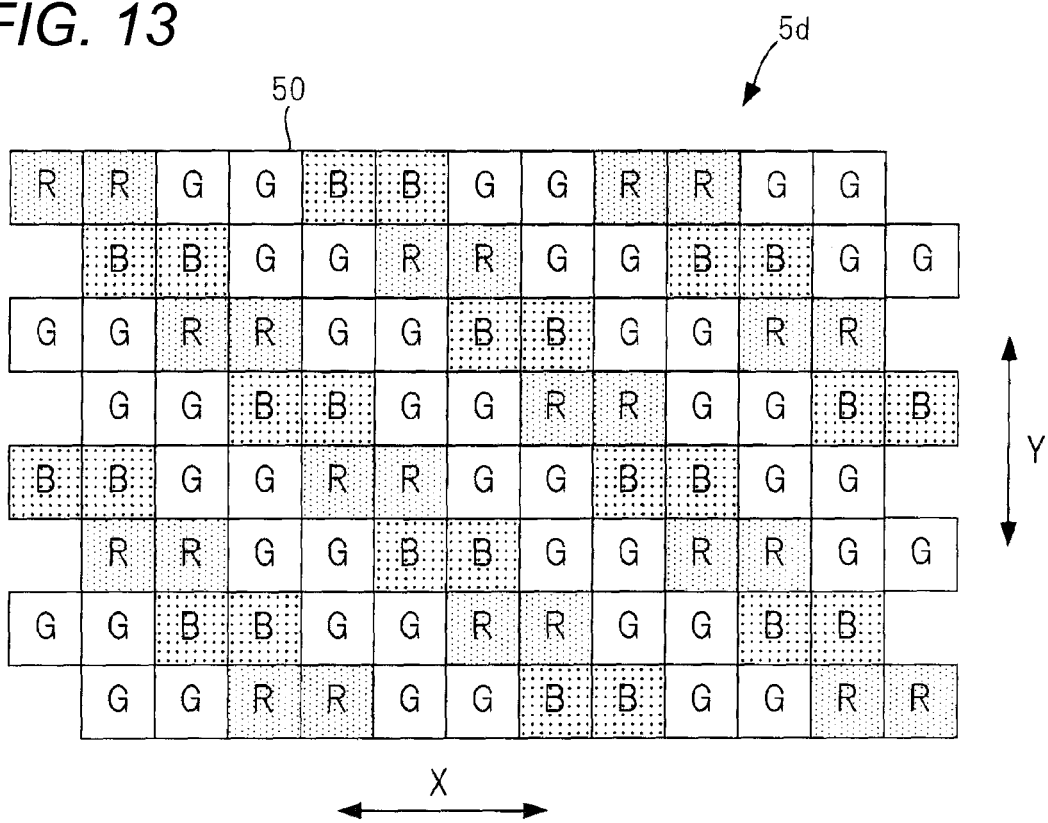
FIG. 13 is a schematic plan view illustrating a configuration of an imaging element 5d which is a modified example of the imaging element 5 illustrated in FIG. 1.

FIG. 13 is a schematic plan view illustrating a configuration of the imaging element 5d which is a modified example of the imaging element 5 illustrated in FIG. 1.

The imaging element 5d is the same as the imaging element 5 in that a pair is formed by two pixel cells which are adjacent to each other in the row direction X and detect the same color light and the pairs are arranged in a honeycomb arrangement.

However, the imaging element 5d is different from the imaging element 5 in that, in the odd-numbered row, RGBG pair rows in which units of an R pair, a G pair, a B pair, and a G pair are arranged in this order are repeatedly arranged in the row direction X and GRGB pair rows in which units of the G pair, the R pair, the G pair, and the B pair are arranged in this order are repeatedly arranged in the row direction X are alternately arranged in the column direction Y.

The imaging element 5d is different from the imaging element 5 in that, in the even-numbered row, BGRG pair rows in which units of the B pair, the G pair, the R pair, and the G pair are arranged in this order are repeatedly arranged in the row direction X and GBGR pair rows in which units of the G pair, the B pair, the G pair, and the R pair are arranged in this order are repeatedly arranged in the row direction X are alternately arranged in the column direction Y.

Figure 14:
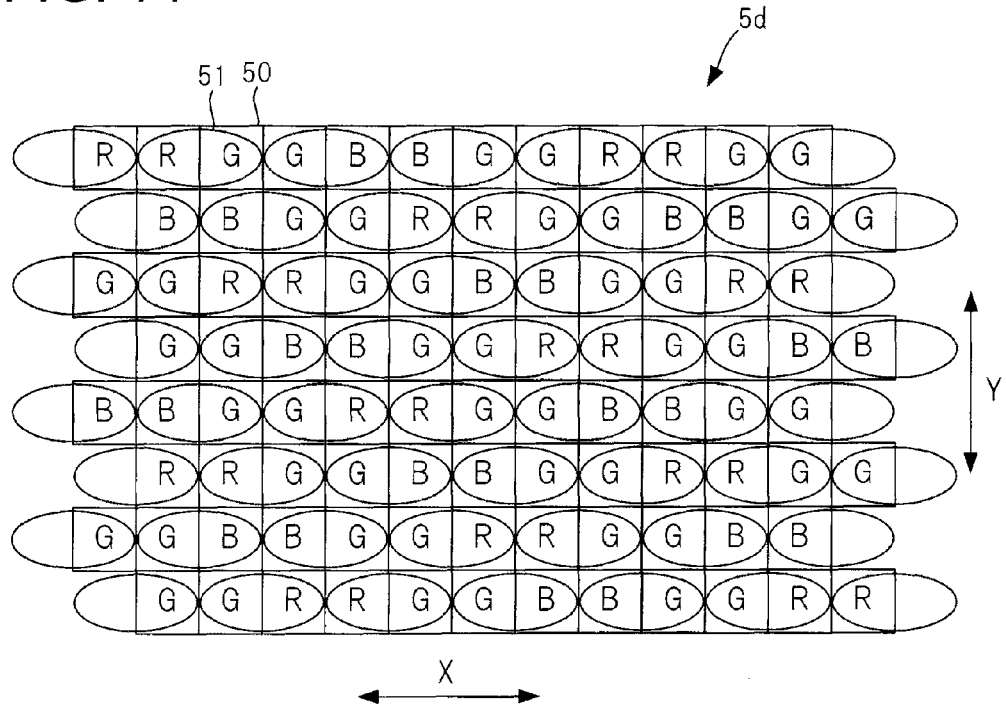
FIG. 14 is a diagram illustrating a micro lens which is mounted in the imaging element 5d illustrated in FIG. 13.

FIG. 14 is a diagram illustrating a micro lens which is mounted in the imaging element 5d illustrated in FIG. 13. In FIG. 14, in order to easily recognize the drawing, hatchings in the R pixel cell 50 and the B pixel cell 50 are omitted.

Similarly to the imaging element 5, even in the imaging element 5d, micro lenses 51 are provided so as to correspond to two pixel cells 50, in the two pixel cells 50 which are adjacent to each other with a boundary of the two adjacent pairs therebetween and the micro lenses 51 are arranged in a honeycomb arrangement.

Figure 15:
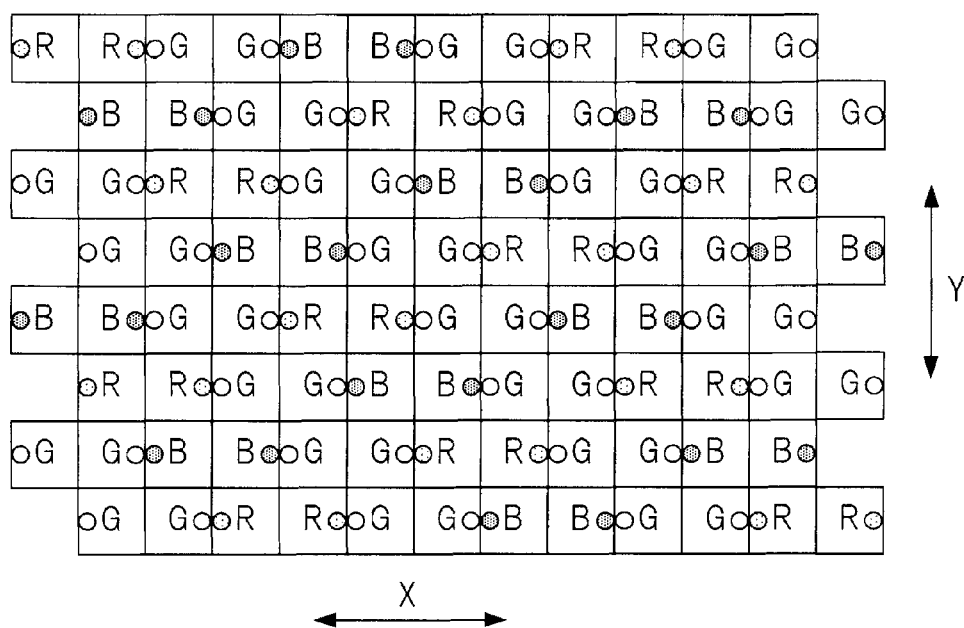
FIG. 15 is a diagram for explaining a spatial sampling position of light by the imaging element 5d.

FIG. 15 is a diagram for explaining a spatial sampling position of light by the imaging element 5. In FIG. 15, a spatial sampling position of the light by the G pixel cell 50 is represented by a white circle, a spatial sampling position of the light by the R cell 50 is represented by a sparsely dot-shaded circle and a spatial sampling position of the light by the B cell 50 is represented by a densely dot-shaded circle.

As illustrated in FIG. 15, in the row direction X and the column direction Y, the imaging element 5d may sample the red light, the green light, and the blue light at a pitch d. Furthermore, the imaging element 5 may sample the red light, the green light, and the blue light at a pitch √2d in a direction of 45° at a right side and a direction of 45° at a left side with respect to the row direction X.

A result of the resolution of the imaging element 5d is represented in Table 1. As represented in Table 1, a resolution which is higher than that of the Bayer type imaging element may be obtained by the imaging element 5d and the resolution may be improved as compared with the imaging element 5a in which two pixel cells of the pair share the micro lens.

As described above, the micro lenses 51 are arranged in a honeycomb arrangement such that the pairs of the pixel cells are two dimensionally arranged and two photoelectric converting units which detect different color light are disposed below each of the micro lens 51 which is provided at least one of the odd-numbered rows and the even-numbered rows, thereby obtaining a high resolution even when the micro lens is shared by two pixel cells 50.

Specifically, like the imaging element 5c, the R pairs and the G pairs are arranged to form a checkerboard pattern in the odd-numbered row and the B pairs and the G pairs are arranged to form a checkerboard pattern in the even-numbered row so that an equivalent resolution with the Bayer type imaging element may be obtained and a high resolution stereoscopic imaging device by the single imaging element and the single lens may be achieved.

Like the imaging element 5d, the R pixel cell 50, the G pixel cell 50, and the B pixel cell 50 are arranged to be included in each row and each column so that a resolution which is higher than that of the Bayer type imaging element may be obtained and a high resolution stereoscopic imaging device by the single imaging element and the single lens may be achieved.

The imaging elements 5, 5b, 5c, and 5d are configured such that two pixel cells 50 which detect different color light share one micro lens 51 in at least one of the odd-numbered row and the even-numbered row. Therefore, a configuration which may suppress color mixture between the pixel cells 50 which share the micro lens 51 is required. Hereinafter, an example of a configuration of a pixel cell which suppress the color mixture will be described.

Figure 16:
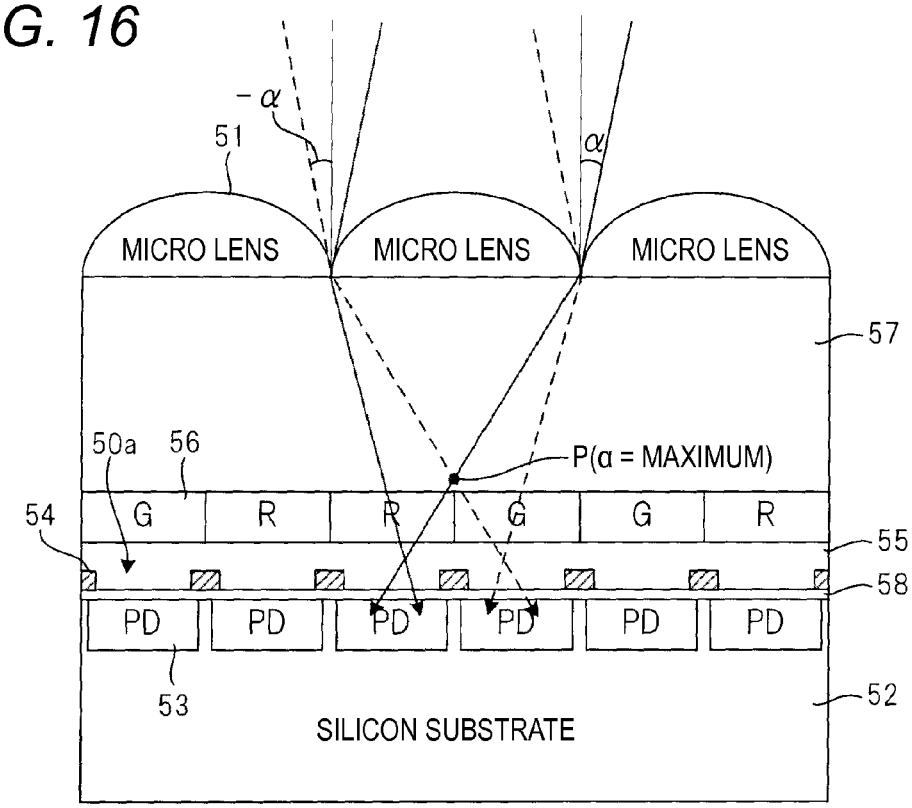
FIG. 16 is a schematic cross-sectional view of six pixel cells 50 in a range A illustrated in FIG. 3 when seen toward a column direction Y.

FIG. 16 is a schematic cross-sectional view of six pixel cells 50 in a range A illustrated in FIG. 3 when seen toward a column direction Y.

A photoelectric converting unit (PD) 53 such as a photo diode is formed on a surface of a silicon substrate 52. An insulating layer 58 is formed on the silicon substrate 52 and a light shielding layer 54 is formed on the insulating layer 58.

An opening 50a is provided above the photoelectric converting unit 53 in the light shielding layer 54 and the photoelectric converting unit which is seen through the opening 50a is denoted by reference numeral 50a in FIG. 3.

An insulating layer 55 is formed on the insulating layer 58 and the light shielding layer 54 and a color filter 56 is formed above the photoelectric converting unit on the insulating layer 55. A color filter 56 above the photoelectric converting unit 53 which is included in the R pixel cell 50 is a color filter through which the red light passes and is denoted by reference character "R" in FIG. 16. A color filter 56 above the photoelectric converting unit 53 which is included in the G pixel cell 50 is a color filter through which the green light passes and is denoted by reference character "G" in FIG. 16. Even though not illustrated, a color filter 56 above the photoelectric converting unit 53 which is included in the B pixel cell 50 is a color filter through which the blue light passes.

An insulating layer 57 is formed on the color filter 56 and a micro lens 51 is formed on the insulating layer 57.

With respect to an optical axis of the micro lens 51, an incident angle of light which is incident onto the micro lens 51 is α (is a positive value when the incident angle leans to the right side further than the optical axis and a negative value when the incident angle leans to the left side further than the optical axis) and a light path of the incident light when the value of a has a maximum value at a positive side is represented by a solid arrow and a light path of the incident light when the value of α has a maximum value at a negative side is represented by a dashed arrow.

In the example of FIG. 16, a micro lens 51 side surface (hereinafter, referred to as a top surface) of the color filter 56 is disposed to be closer to the silicon substrate 52 than a point P (a point at which a light ray which is incident onto one end of the micro lens 51 at a maximum incident angle α intersects with a light ray which is incident onto the other end of the micro lens 51 at a maximum angle α below the micro lens 51) at which the dashed arrow intersects with the solid arrow in FIG. 16 so as to prevent the occurrence of the color mixture in two photoelectric converting units 53 which are below the micro lens 51.

Therefore, the light represented by the solid arrow of FIG. 16 passes through only the color filter 56 of the R pixel cell 50 to be incident onto the photoelectric converting unit 53. Further, the light represented by the dashed arrow of FIG. 16 passes through only the color filter 56 of the G pixel cell 50 to be incident onto the photoelectric converting unit 53. Therefore, the color mixture occurrence is prevented in two photoelectric converting units corresponding to the same micro lens 51 and thus a captured image quality may be improved.

Figure 17:
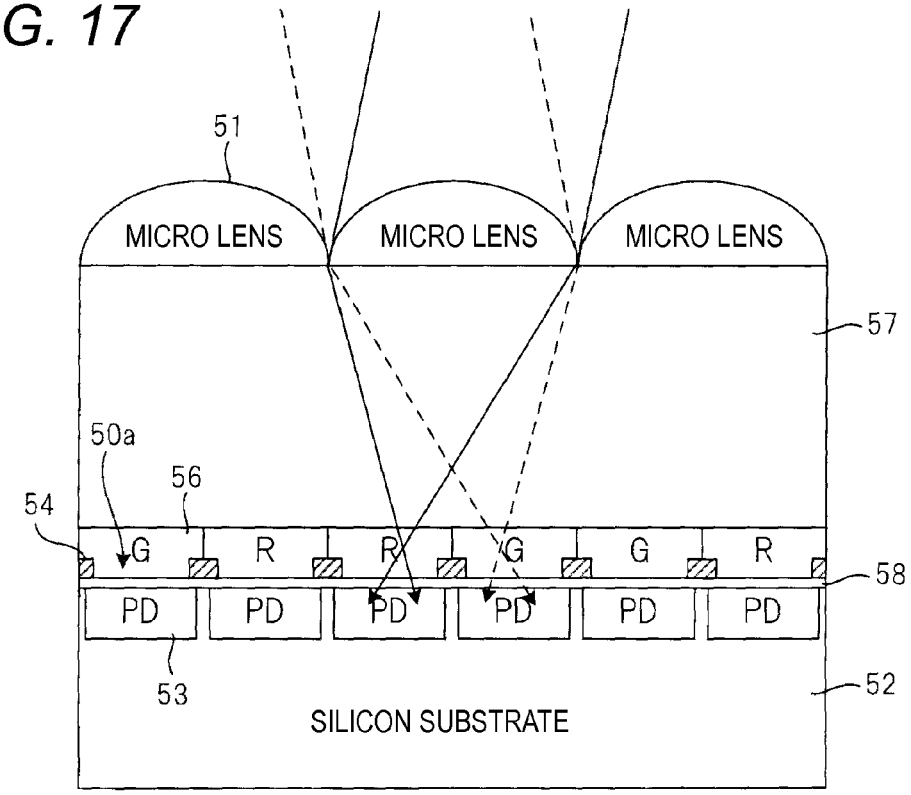
FIG. 17 is a diagram illustrating a modified example of a cross-section of six pixel cells 50 in a range A illustrated in FIG. 3 when seen toward a column direction Y.

The top surface of the color filter 56 is lowered from the position of FIG. 16 to a position as described in FIG. 17 and a focal point of the micro lens 51 with respect to the light at the maximum incident angle is disposed in the layer where the color filter 56 is formed, thereby further preventing the color mixture.

Figure 18:
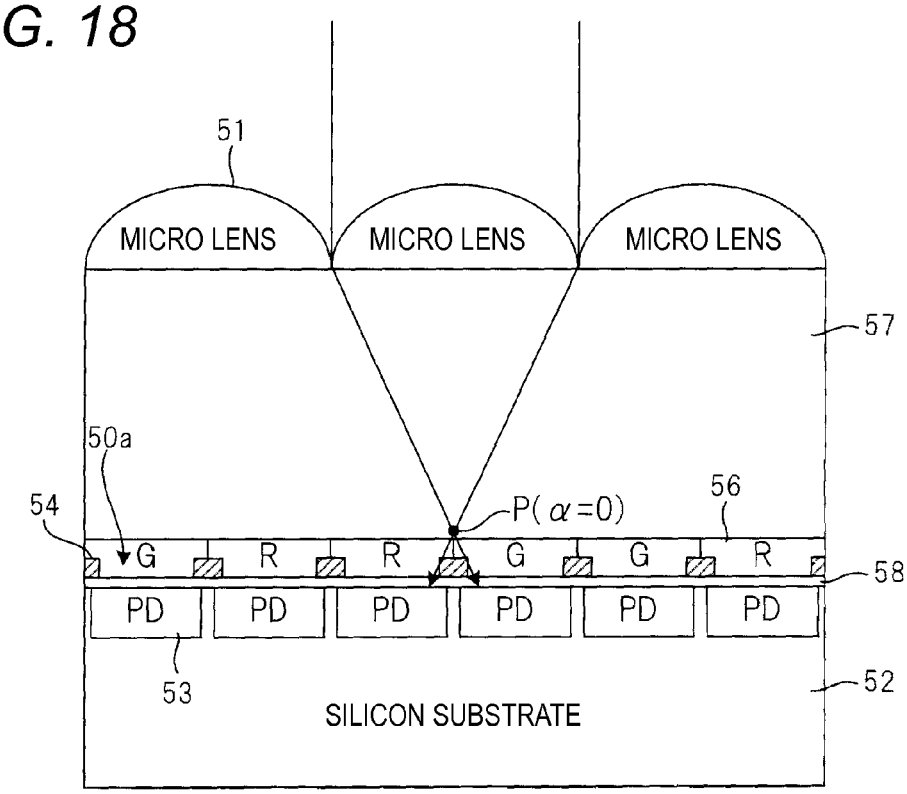
FIG. 18 is a diagram illustrating a modified example of a cross-section of six pixel cells 50 in a range A illustrated in FIG. 3 when seen toward a column direction Y.

When the angle α illustrated in FIG. 16 approaches zero, the point P in FIG. 16 moves toward the silicon substrate 52. As illustrated in FIG. 18, the color mixture occurrence may be further prevented by approaching the top surface of the color filter 56 to the silicon substrate 52 than the point P when a is zero.

Sensitivities of two photoelectric converting units 53 which share the micro lens 51 are lowered as the incident angle of the light onto the micro lens 51 is decreased. Therefore, the top surface of the color filter 56 is disposed at least at a position which is lower than the point P when a is the maximum so that the color mixture which significantly affects the captured image quality may be prevented.

As described above, a distance between the color filter 56 and the photoelectric converting unit 53 in the silicon substrate 52 is reduced, thereby preventing the color mixture. In the case of a so-called back illumination type imaging element in which a photoelectric converting unit is formed in a semiconductor substrate, such as silicon and a read-out circuit which reads a signal in accordance with charges accumulated in the photoelectric converting unit is formed on a surface of the semiconductor substrate which is opposite to a light incident side, it is easy to reduce a distance between the silicon substrate and the color filter. Therefore, the imaging elements 5, 5b, 5c, and 5d are appropriate for the back illumination type imaging element.

Next, descriptions will be made on a configuration of a smart phone as an imaging device.

Figure 19:
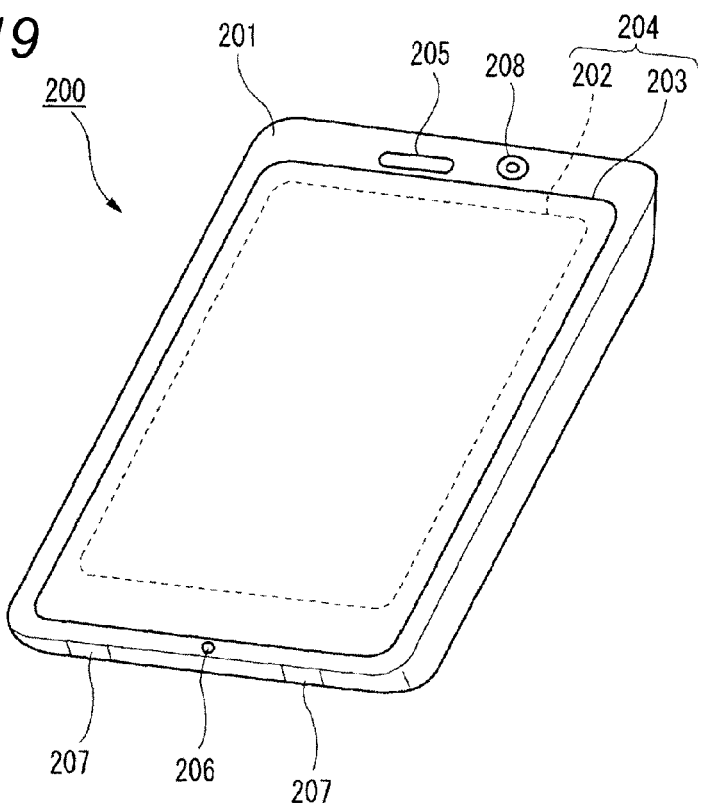
FIG. 19 is a diagram illustrating a configuration of a smart phone as an imaging device.

FIG. 19 illustrates an outer appearance of a smart phone 200 which is an embodiment of the imaging device of the present invention. The smart phone 200 illustrated in FIG. 19 includes a flat panel type case 201 and is provided, on one surface of the case 201, with a display input unit 204 in which a display panel 202 as a display unit, and an operating panel 203 as an input unit are integrally formed. In addition, such a case 201 includes a speaker 205, a microphone 206, an operating unit 207, and a camera 208. However, the configuration of the case 201 is not limited thereto. For example, a configuration in which the display unit and the input unit are independent from each other may be employed or a configuration having a folding structure or a slide mechanism may be employed.

Figure 20:
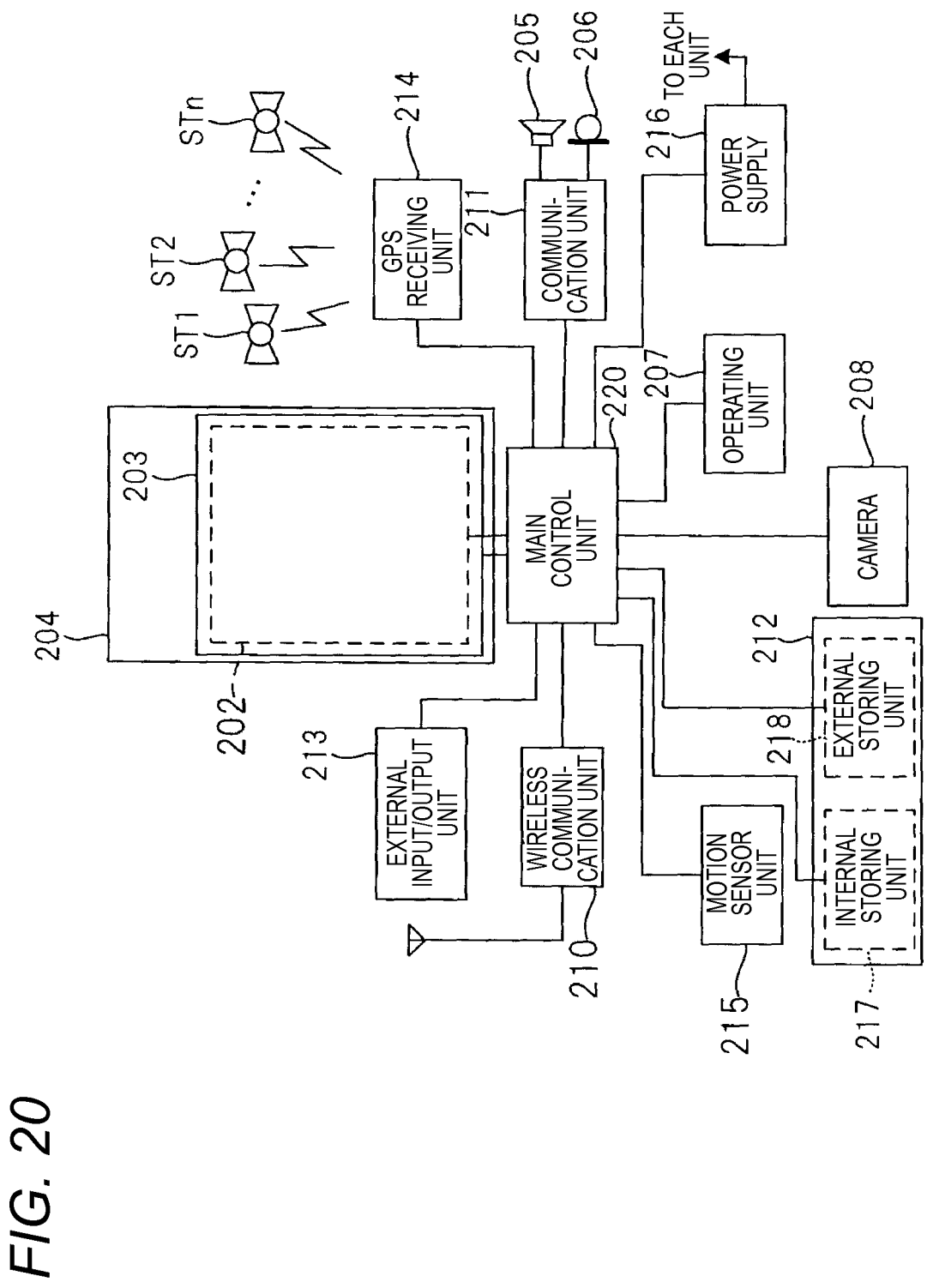
FIG. 20 is a block diagram illustrating an internal configuration of the smart phone illustrated in FIG. 19.

FIG. 20 is a block diagram illustrating a configuration of the smart phone 200 illustrated in FIG. 19. As illustrated in FIG. 20, as main components, the smart phone includes a wireless communication unit 210, a display input unit 204, a calling unit 211, an operating unit 207, a camera 208, a storing unit 212, an external input/output unit 213, a global positioning system (GPS) receiving unit 214, a motion sensor unit 215, a power supply 216, and a main control unit 220. Further, as a main function of the smart phone 200, the smart phone 200 is provided with a wireless communication function which performs mobile wireless communication through a base station device BS which is not illustrated and a mobile communication network NW which is not illustrated.

The wireless communication unit 210 performs wireless communication with the base station device BS which is accommodated in the mobile communication network NW in accordance with an instruction of the main control unit 220. The wireless communication unit 210 transmits/receives various file data such as voice data and image data and electronic mail data or receives web data or streaming data using the wireless communication.

The display input unit 204 is provided with a display panel 202 and an operating panel 203 as a so-called touch panel which displays an image (a still image or a moving picture) or text information so as to visually transmit information to a user, and detects the user's operation on displayed information, under the control of the main control unit 220.

The display panel 202 uses a liquid crystal display (LCD), an organic electro-luminescence display (OELD), or the like, as a display device.

The operating panel 203 is a device which is mounted so as to visibly recognize an image which is displayed on a display surface of the display panel 202 to detect one or a plurality of coordinates and is operated by a finger of the user or a stylus. When the device is operated by the finger of the user or the stylus, a detection signal which is generated due to the operation is output to the main control unit 220. Subsequently, the main control unit 220 detects an operating position (coordinate) on the display panel 202, based on the received detection signal.

As illustrated in FIG. 19, although the display panel 202 and the operating panel 203 of the smart phone 200 exemplified as an embodiment of the imaging device of the present invention are integrally formed with each other to constitute the display input unit 204, the operating panel 203 is disposed to completely cover the display panel 202.

When such an arrangement is employed, the operating panel 203 may be provided with a function of detecting the user's operation on a region other than the display panel 202. In other words, the operating panel 203 may include a detection region (hereinafter, referred to as a "display region") on an overlapping portion which overlaps the display panel 202 and a detection region (hereinafter, referred to as a "non-display region") for other outer peripheral portions which do not overlap the display panel 202.

Although the size of the display region and the size of the display panel 202 may completely coincide with each other, both sizes do not necessarily coincide with each other. In addition, the operating panel 203 may include two sensitive regions of an outer peripheral portion and an inner portion other than the outer peripheral portion. Moreover, a width of the outer peripheral portion is appropriately designed in accordance with the size of the case 201. Moreover, as a position detecting system employed in the operating panel 203, a lattice switch system, a resistive layer system, a surface elastic wave system, an infrared system, an electromagnetic induction system, or an electrostatic capacitive system may be exemplified, and any system may be employed.

The calling unit 211 includes the speaker 205 or the microphone 206 and converts the user's voice input through the microphone 206 into voice data to be processed by the main control unit 220 and outputs the converted voice data to the main control unit 220, or decodes voice data received by the wireless communication unit 210 or the external input/output unit 213 and outputs the decoded voice data from the speaker 205. Furthermore, as illustrated in FIG. 19, for example, the speaker 205 may be mounted on the same surface as the surface provided with the display input unit 204 and the microphone 206 may be mounted on a side surface of the case 201.

The operating unit 207 is a hardware key which uses a key switch and receives an instruction from the user. For example, as illustrated in FIG. 8, the operating unit 207 is a push button type switch which is mounted on a side surface of the case 201 of the smart phone 200 and turned on when the operating unit 207 is pressed by a finger and turned off by restoring force of a spring when the finger is removed.

The storing unit 212 stores a control program or control data of the main control unit 220, application software, address data to which names, phone numbers, or the like of communication counterparts are correlated, transmitted/received electronic mail data, web data downloaded by web browsing or downloaded content data, and temporarily stores streaming data. Further, the storing unit 212 is configured by an internal storing unit 217 which is mounted in the smart phone and an external storing unit 218 which is detachable and includes an external memory slot. Furthermore, the internal storing unit 217 and the external storing unit 218 which configure the storing unit 212 are implemented by using a storing medium such as a flash memory type, hard disk type, multimedia card micro type, card type memory (for example, MicroSD (registered trademark) memory), a random access memory (RAM), or a read only memory (ROM).

The external input/output unit 213 functions as an interface with all external devices which are connected to the smart phone 200 and is configured to be directly or indirectly connected to any other external device by communication (for example, universal serial bus (USB) or IEEE1394) or a network (for example, Internet, wireless LAN, Bluetooth (registered trademark), a radio frequency identification (RFID), an infrared data association (IrDA (registered trademark)), ultra wideband (UWB: registered trademark), or a ZigBee (registered trademark).

As external devices connected to the smart phone 200, a wired/wireless head set, a wired/wireless external charger, a wired/wireless data port, a memory card or a SIM (subscriber identity module) card/UIM (user identity module) card connected through a card socket, an external audio/video device connected through an audio/video input/output (I/O) terminal, a wirelessly connected external audio/video device, a wiredly/wirelessly connected smart phone, a wiredly/wirelessly connected personal computer, a wiredly/wirelessly connected PDA, a wiredly/wirelessly connected personal computer, or an earphone may be exemplified. The external input/output unit 213 may transmit data which is received from such external devices to individual components in the smart phone 200 and may also allow the data in the smart phone 200 to be transmitted to an external device.

The GPS receiving unit 214 receives GPS signals which are transmitted from GPS satellites ST1 to STn according to an instruction from the main control unit 220 and performs a position measurement operation processing based on the received GPS signals to detect positions including a latitude, a longitude, and a height of the smart phone 200. When the GPS receiving unit 214 may obtain positional information from the wireless communication unit 210 or the external input/output unit 213 (for example, the wireless LAN), the GPS receiving unit 214 may detect a position using that positional information.

The motion sensor unit 215 includes, for example, a three axis acceleration sensor and detects physical movement of the smart phone 200 according to the instruction of the main control unit 220. When the physical movement of the smart phone 200 is detected, the movement direction or acceleration of the smart phone 200 is detected. The detected result is output to the main control unit 220.

The power supply 216 supplies power which is accumulated in a battery (not illustrated) to individual units of the smart phone 200 according to the instruction of the main control unit 220.

The main control unit 220 includes a microprocessor and operates according to a control program or control data stored in the storing unit 212 and collectively controls individual units of the smart phone 200. Further, the main control unit 220 is provided with a mobile communication control function and an application processing function to control individual units of a communication system in order to perform voice communication or data communication through the wireless communication unit 210.

The application processing function is implemented when the main control unit 220 is operated according to the application software which is stored in the storing unit 212. The application processing function includes, for example, an infrared communication function which performs data communication with a counterpart device by controlling the external input/output unit 213, an electronic mail function which transmits/receives an electronic mail, or a web browsing function which browses a web page.

The main control unit 220 is provided with an image processing function which displays an image on the display input unit 204 based on the image data (still image or moving picture data) such as received data or downloaded streaming data. The image processing function refers to a function of decoding the image data and performing image processings on the decoded result to display the image on the display input unit 204 by the main control unit 220.

The main control unit 220 executes a display control of the display panel 202 and an operation detection control which detects a user's operation through the operating unit 207 and the operating panel 203. By executing the display control, the main control unit 220 displays an icon to activate application software or a software key such as a scroll bar or displays a window for preparing electronic mail. Here, the scroll bar refers to a software key for receiving an instruction to move a displayed portion of an image with respect to a large image which is not covered by the display region of the display panel 202.

When the operation detection control is executed, the main control unit 220 detects the user's operation through the operating unit 207 or receives an operation on the icon or the input of a character string onto an input section of the window through the operating panel 203 or receives a scroll request of a displayed image through the scroll bar.

By executing the operation detection control, the main control unit 220 determines whether the operating position of the operating panel 203 is an overlapping portion (display region) which overlaps the display panel 202 or an outer peripheral portion (non-display region) which does not overlap the display panel 202 other than the overlapping portion, and is provided with a touch panel control function that controls a sensitive region of the operating panel 203 or a display position of the software key.

The main control unit 220 may detect a gesture operation with respect to the operating panel 203 and execute a predetermined function according to the detected gesture operation. The gesture operation refers to an operation which draws a trace using a finger, designates a plurality of positions simultaneously, or a combination thereof to draw a trace for at least one from the plurality of positions, rather than a simple touch operation of the related art.

The camera 208 includes constitutional elements other than the external memory control unit 20, the recording medium 21, the display control unit 22, the display unit 23, and the operating unit 14 in the digital camera which is illustrated in FIG. 1. Captured image data which is generated by the camera 208 may be stored in the storing unit 212 or output through the external input/output unit 213 or the wireless communication unit 210. As illustrated in FIG. 19, although the camera 208 is mounted on the same surface as the display input unit 204 in the smart phone 200, the mounting position of the camera 208 is not limited thereto and the camera 208 may be mounted on a rear surface of the display input unit 204.

The camera 208 may be used for various functions of the smart phone 200. For example, an image which is obtained by the camera 208 may be displayed on the display panel 202 or the image of the camera 208 may be used as one of the operation inputs of the operating panel 203. Further, when the GPS receiving unit 214 detects the position, the position may be detected with reference to the image from the camera 208. Moreover, an optical axis direction of the camera 208 of the smart phone 200 may be determined or a current usage environment may also be determined with reference to the image from the camera 208, either without using the 3-axis acceleration sensor or using the 3-axis acceleration sensor. Of course, the image from the camera 208 can be used in the application software.

Positional information obtained by the GPS receiving unit 214, voice information obtained by the microphone 206 (which may be text information obtained by performing a voice-text conversion by the main control unit or the like), or posture information obtained by the motion sensor unit 215 may be added to the image data of a still image or a moving picture to be stored in the storing unit 212 or output through the external input/output unit 213 or the wireless communication unit 210.

Even in the smart phone 200 having the above-described configuration, phase difference AF may be performed with high precision and at a high speed.

Various modifications of the above-described embodiment may be made with equivalents to a scope of the claims and within the scope of the claims.

For example, in the imaging elements 5, 5b, 5c, and 5d, the R pixel cell 50 may be replaced with the B pixel cell and the B pixel cell 50 may be replaced with the R pixel cell 50.

The photoelectric converting unit which is included in the pixel cell 50 may be configured by a layer which is formed of a photoelectric converting material which is laminated on the substrate. For example, in the cross-sectional view of FIG. 16, instead of the photoelectric converting unit 53, a photoelectric converting layer which is formed of a photoelectric converting material which absorbs visible light and generates charges in accordance with the absorbed light may be provided to be shared between the insulating layer 58 and the color filter 56 for overall pixel cells 50 and a signal in accordance with the charges generated in the photoelectric converting layer of each of the pixel cells 50 may be read out by an MOS circuit provided in each of the pixel cells 50.

As described above, the specification discloses the following matters.

It is disclosed an imaging element having a plurality of pixel cells which is arranged in a row direction and a column direction which is perpendicular to the row direction in a lattice, in which the plurality of pixel cells includes a first pixel cell which includes a photoelectric converting unit which detects red light, a second pixel cell which includes a photoelectric converting unit which detects green light, and a third pixel cell which includes a photoelectric converting unit which detects blue light, two adjacent pixel cells which include photoelectric converting units which detect the same color light form a pair and the pairs are periodically arranged, in each of pixel cell rows in which pixel cells are arranged in the row direction, one micro lens is disposed over two photoelectric converting units which are included in the two pixel cells at every two pixel cells which are adjacent in the row direction, the micro lenses are arranged such that the micro lenses in odd-numbered pixel cell rows is off-centered in the row direction from the micro lenses in even-numbered pixel cell rows by a half of an arrangement pitch of the micro lenses, and each micro lens which is provided in at least one of the odd-numbered row and the even-numbered row is disposed over two photoelectric converting units which detect different color light.

It is disclosed the imaging element, in which the pair in the odd-numbered row is off-centered in the row direction from the pair in even-numbered row by a half of an arrangement pitch of the pairs in the pixel cell rows, and each micro lens which is provided in the odd-numbered row and the even-numbered row is disposed over two photoelectric converting units which detect different color light.

It is disclosed the imaging element, in which when seen only from ones of the even-numbered rows and the odd-numbered rows, R pairs which detect red light, G pairs which detect green light, and B pairs which detect blue light are arranged to form a Bayer pattern, and when seen only from the other ones of the even-numbered rows and the odd-numbered rows, the R pairs, the G pairs, and the B pairs are arranged to form a Bayer pattern.

It is disclosed imaging element, in which when seen from only ones of the even-numbered rows and the odd-numbered rows, R pairs which detect red light are arranged in positions of a checkerboard pattern and G pairs which detect green light are arranged in the other positions of the checkerboard pattern, and when seen only from the other ones of the even-numbered rows and the odd-numbered rows, B pairs which detect blue light are arranged in positions of a checkerboard pattern and the G pairs are arranged in the other positions of the checkerboard pattern.

It is disclosed the imaging element, in which when seen from only ones of the even-numbered rows and the odd-numbered rows, rows each in which units each in which an R pair which detects red light, a G pair which detects green light, a B pair which detect blue light, and the G pair are arranged in this order are repeatedly arranged in the row direction and rows each in which units each in which the G pair, the R pair, the G pair, and the B pair are arranged in this order are repeatedly arranged in the row direction are alternately arranged in the column direction, and when seen only from the other ones of the even-numbered rows and the odd-numbered rows, rows each in which units each in which the B pair, the G pair, the R pair, and the G pair are arranged in this order are repeatedly arranged in the row direction and rows each in which units each in which the G pair, the B pair, the G pair, and the R pair are arranged in this order are repeatedly arranged in the row direction are alternately arranged in the column direction.

It is disclosed the imaging element, in which when seen from only ones of the even-numbered rows and the odd-numbered rows, G pairs which detect the green light are arranged in a lattice, and when seen only from the other ones of the even-numbered rows and the odd-numbered rows, R pairs which detect red light are arranged in positions of a checkerboard pattern and B pairs which detect blue light are arranged in the other positions of the checkerboard pattern.

It is disclosed the imaging element, in which each of the plurality of pixel cells includes a color filter provided between the photoelectric converting unit and the micro lens which is disposed above the photoelectric converting unit, color light detected by the photoelectric converting unit passing through the color filter, and a surface of the color filter on a side of the micro lens is arranged to be closer to a side of the photoelectric converting unit than a point at which light rays which are incident onto both ends of the micro lens at maximum incident angles intersect with each other.

It is disclosed the imaging element, in which the surface of the color filter on the side of the micro lens is arranged to be closer to the side of the photoelectric converting unit than a focal point of the micro lens with respect to light being incident at a incident angles of 0 degree.

It is disclosed the imaging element, in which the focal point of the micro lens is disposed in a layer where the color filter is provided.

It is disclosed the imaging element of back illumination type.

It is disclosed an imaging device, including the imaging element.

According to the imaging element of the present invention, the resolution is improved by employing an imaging element configured such that one micro lens is provided for two photoelectric converting units, so that the imaging element may be efficiently applied to an imaging device such as a digital camera.

Although the present invention has been described above by the specific embodiment, the present invention is not limited to the embodiment but various modifications may be allowed without departing from a technical spirit of the disclosed invention.

This application is based on Japanese Patent Application No. 2012-129816, filed on Jun. 7, 2012, and the content of which is incorporated herein by reference.

What is claimed is:

1. An imaging element having a plurality of pixel cells which is arranged in a row direction and a column direction which is perpendicular to the row direction in a lattice,
wherein the plurality of pixel cells includes a first pixel cell which includes a photoelectric converting unit which detects red light, a second pixel cell which includes a photoelectric converting unit which detects green light, and a third pixel cell which includes a photoelectric converting unit which detects blue light,
two adjacent pixel cells which include photoelectric converting units which detect the same color light form a pair and the pairs are periodically arranged, in each of pixel cell rows in which pixel cells are arranged in the row direction,
one micro lens is disposed over two photoelectric converting units which are included in the two pixel cells at every two pixel cells which are adjacent in the row direction,
the micro lenses are arranged such that the micro lenses in odd-numbered pixel cell rows is off-centered in the row direction from the micro lenses in even-numbered pixel cell rows by a half of an arrangement pitch of the micro lenses, and
each micro lens which is provided in at least one of the odd-numbered row and the even-numbered row is disposed over two photoelectric converting units which detect different color light, wherein the pair in the odd-numbered row is off-centered in the row direction from the pair in even-numbered row by a half of an arrangement pitch of the pairs in the pixel cell rows, and each micro lens which is provided in the odd-numbered row and the even-numbered row is disposed over two photoelectric converting units which detect different color light.

2. The imaging element of claim 1, wherein when seen only from ones of the even-numbered rows and the odd-numbered rows, R pairs which detect red light, G pairs which detect green light, and B pairs which detect blue light are arranged to form a Bayer pattern, and when seen only from the other ones of the even-numbered rows and the odd-numbered rows, the R pairs, the G pairs, and the B pairs are arranged to form a Bayer pattern.

3. The imaging element of claim 1, wherein when seen from only ones of the even-numbered rows and the odd-numbered rows, R pairs which detect red light are arranged in positions of a checkerboard pattern and G pairs which detect green light are arranged in the other positions of the checkerboard pattern, and when seen only from the other ones of the even-numbered rows and the odd-numbered rows, B pairs which detect blue light are arranged in positions of a checkerboard pattern and the G pairs are arranged in the other positions of the checkerboard pattern.

4. The imaging element of claim 1, wherein when seen from only ones of the even-numbered rows and the odd-numbered rows, rows each in which units each in which an R pair which detects red light, a G pair which detects green light, a B pair which detect blue light, and the G pair are arranged in this order are repeatedly arranged in the row direction and rows each in which units each in which the G pair, the R pair, the G pair, and the B pair are arranged in this order are repeatedly arranged in the row direction are alternately arranged in the column direction, and when seen only from the other ones of the even-numbered rows and the odd-numbered rows, rows each in which units each in which the B pair, the G pair, the R pair, and the G pair are arranged in this order are repeatedly arranged in the row direction and rows each in which units each in which the G pair, the B pair, the G pair, and the R pair are arranged in this order are repeatedly arranged in the row direction are alternately arranged in the column direction.

5. The imaging element of claim 1, wherein when seen from only ones of the even-numbered rows and the odd-numbered rows, G pairs which detect the green light are arranged in a lattice, and when seen only from the other ones of the even-numbered rows and the odd-numbered rows, R pairs which detect red light are arranged in positions of a checkerboard pattern and B pairs which detect blue light are arranged in the other positions of the checkerboard pattern.

6. An imaging device, comprising the imaging element of claim 1.

\* \* \* \* \*